United States Patent
Lee

(10) Patent No.: US 6,207,528 B1
(45) Date of Patent: Mar. 27, 2001

(54) METHOD FOR FABRICATING CAPACITOR OF SEMICONDUCTOR DEVICE

(75) Inventor: Kee-jeung Lee, Seoul (KR)

(73) Assignee: Hyundai Electronics Industries Co., Ltd., Kyunggi-do (KR)

( * ) Notice: Subject to any disclaimer, the term of this patent is extended or adjusted under 35 U.S.C. 154(b) by 0 days.

(21) Appl. No.: 09/475,678

(22) Filed: Dec. 30, 1999

(30) Foreign Application Priority Data

Dec. 31, 1998 (KR) .................................................. 98-63681

(51) Int. Cl.⁷ ...................................................... H01L 21/20
(52) U.S. Cl. .......................... 438/398; 438/255; 438/396
(58) Field of Search ..................................... 438/255, 396, 438/398, 964; H01L 21/20

(56) References Cited

U.S. PATENT DOCUMENTS

| | | | | |
|---|---|---|---|---|
| 3,949,275 | * | 4/1976 | Muenz ................................... | 361/766 |
| 4,670,355 | * | 6/1987 | Matsudaira ............................ | 428/690 |
| 5,134,086 | * | 7/1992 | Ahn ....................................... | 438/398 |
| 5,486,488 | * | 1/1996 | Kamiyama ............................ | 438/396 |
| 5,741,734 | * | 4/1998 | Lee ........................................ | 438/235 |
| 6,136,641 | * | 10/2000 | Won et al. ............................. | 438/240 |

OTHER PUBLICATIONS

Fazan et al., A High–C Capacitor with Ultrathin CVD—Ta2O5 Films Deposited on Rugged Poly–Si for High Density DRAMs, IEDM Technical Digest, 1992, pp. 263–266.*

Kamiyama et al., Ultra–Thin TiN/Ta2O5/W Capacitor Technology for 1Gbit DRAM, IEDM Technical Digest, 1993, pp. 49–52.*

Tang et al., Trends in DRAM Dielectrics, IEEE Circuits and Devices Magazine, 13 (May 1997) 27–34.*

Lim et al., Novel Al2O3 Capacitor for High Density DRAMs, International Conference on VLSI and CAD, 1999, pp. 506–509.*

Banerjee et al., Fabrication and Performance of Selective HSG Storage Cells for 256 Mb and 1 Gb RAM Applications, IEEE Transactions on Electron Devices, 47 (Mar. 2000) 584–592.*

Ha et al., A Cost Effective Embedded DRAM Integration for High Density Memory and High Performance Logic Using 0.15 Micron Technology Node and Beyond, IEEE Transactions on Electron Devices, 47 (Jul. 2000) 1499–1506.*

* cited by examiner

Primary Examiner—Vu A. Le
Assistant Examiner—Christian D. Wilson
(74) Attorney, Agent, or Firm—Crompton, Seager & Tufte, LLC

(57) ABSTRACT

The invention relates to a method for fabricating a capacitor of a semiconductor device with greater capacitance by adding an aluminum containing compound in the process of depositing an amorphous $Ta_2O_5$ layer in a LPCVD chamber, differently from the conventional method, thereby obtaining a material $Ta_2O_5$—$Al_2O_3$ for forming a dielectric layer with higher structural stability and dielectric constant than the $Ta_2O_5$ layer.

29 Claims, 4 Drawing Sheets

METHOD FOR FABRICATING CAPACITOR OF SEMICONDUCTOR DEVICE

BACKGROUND OF THE INVENTION

1. Field of the Invention

The present invention relates to a method for fabricating a semiconductor device, and more particularly to a method for fabricating a capacitor of a semiconductor device with greater capacitance by depositing a dielectric layer with a dielectric material, $Ta_2O_5$—$Al_2O_3$ with higher structural stability and dielectric constant than a $Ta_2O_5$ layer, wherein the $Ta_2O_5$—$Al_2O_3$ layer is obtained by adding an aluminum containing compound in the process of depositing a conventional dielectric $Ta_2O_5$ layer.

2. Description of the Prior Art

FIG. 1 is a cross-sectional view for illustrating an embodiment of a semiconductor capacitor with a $Ta_2O_5$ layer as a dielectric layer in accordance with the prior art.

As shown in FIG. 1, a conventional method for fabricating the $Ta_2O_5$ capacitor to be used for a semiconductor DRAM device will be described below.

First of all, doped polysilicon is used for forming a bottom electrode 5, a storage node on a semiconductor substrate, and a $Ta_2O_5$ layer 9 is deposited as a dielectric layer on the polysilicon layer 5 by a plasma enhanced chemical vapor deposition (PECVD) method or low pressure CVD (LPCVD) method. In addition, a top electrode (plate electrode) 11, 13 is deposited with TiN and/or polysilicon, thereby forming a capacitor for a DRAM device.

However, for the process of depositing a dielectric layer, a PECVD method of forming a high quality dielectric layer, and a LPCVD method of forming a dielectric layer with low quality but high step coverage, have been mainly applied for depositing the $Ta_2O_5$ layer.

Since the $Ta_2O_5$ layer 9 generally has an unstable stoichiometry, some substitution type Ta vacancy atoms inevitably remain in the dielectric layer due to a difference in the composition ratio of Ta and O. Furthermore, in the process of forming the $Ta_2O_5$ dielectric layer, an organic material of $Ta(OC_2H_5)_5$, a precursor of $Ta_2O_5$, and $O_2$ (or $N_2O$) gas are reacted to release and co-exist carbon atoms (C), hydrocarbon ($CH_4$, $C2H4$ etc.) and water ($H_2O$)

On the other hand, FIG. 2 is a schematic view for illustrating internal chemical composition and properties of the $Ta_2O_5$ layer shown in FIG. 1.

As the $Ta_2O_5$ layer 9 is shown in the drawing, due to unstable stoichiometry, it remains in a state of $Ta_xO_y$, releasing some substitution type Ta vacancy atoms caused by difference in the composition ratio of Ta and O. Furthermore, an organic material of $Ta(OC_2H_5)_5$, a precursor of $Ta_2O_5$, and $O_2$ (or $N_2O$) gas are reacted to release and co-exist carbon atoms (C), hydrocarbon ($CH_4$, C2H4 etc.) and water ($H_2O$) as well.

Therefore, there is a problem in the conventional $Ta_2O_5$ capacitor in that the conventional $Ta_2O_5$ capacitor increases current leakage and deteriorates dielectric characteristic due to impurities like carbon atoms, ions, radicals remaining in the $Ta_2O_5$ dielectric layer, thereby putting a great limitation in application of the $Ta_2O_5$ capacitor for a mass production of DRAM devices.

SUMMARY OF THE INVENTION

Therefore, it is an object of the present invention to solve the aforementioned problem and provide a method for fabricating a capacitor of a semiconductor device with greater capacitance by adding an aluminum containing compound in the process of depositing an amorphous $Ta_2O_5$ layer in a LPCVD chamber, differently from the conventional method, thereby obtaining a material $Ta_2O_5$—$Al_2O_3$ for forming a dielectric layer with higher structural stability and dielectric constant than the $Ta_2O_5$. layer.

In order to accomplish the aforementioned objects of the present invention, there is provided a method for fabricating a capacitor of a semiconductor device comprising the steps of: forming a hemispherical polysilicon layer on a bottom electrode of a storage node; nitrifying the surface of the polysilicon layer for preventing formation of a natural oxide layer on the hemispherical polysilicon layer; forming a $Ta_2O_5$—$Al_2O_3$ layer on the surface nitrified polysilicon layer; and forming a plate electrode by depositing metal on the $Ta_2O_5$—$Al_2O_3$ layer.

Some principles applied in the process of fabricating a capacitor of the present invention will be described below.

According to the present invention, in the process of depositing the amorphous $Ta_2O_5$ through the LPCVD method, a $(Ta_2O_5)_{1-x}$—$(Al_2O_3)_x$ ($0 \leq x \leq 0.5$) layer ($\epsilon=40$) with a higher dielectric characteristic can be obtained by adding an aluminum containing compound through a surface chemical reaction. Furthermore, the $Ta_2O_5$—$Al_2O_3$ layer has a structural stability because there are covalent bonds between a perovskite type structure of $Al_2O_3$ and $Ta_2O_5$ in the resultant dielectric layer.

On the other hand, due to unstable chemical stoichiometry of the $Ta_2O_5$ layer, there may partially be oxygen vacancy state of substitution type Ta atoms. However, the number of oxygen vacancies in the aforementioned $Ta_2O_5$—$Al_2O_3$ layer may be varied depending on the quantity and bonding state of $Al_2O_3$ compound, but it is smaller than the pure form of the $Ta_2O_5$ layer. As a result, the $Ta_2O_5$—$Al_2O_3$ capacitor is relatively smaller in the level of current leakage than $Ta_2O_5$ capacitor.

BRIEF DESCRIPTION OF THE DRAWINGS

Objects and aspects of the invention will become apparent from the following description of an embodiment with reference to the accompanying drawings in which.

DETAILED DESCRIPTION OF THE PRESENT INVENTION

A method for fabricating a capacitor of the present invention will be described in accordance with a preferred embodiment with reference to the accompanying drawings.

Figure 1:
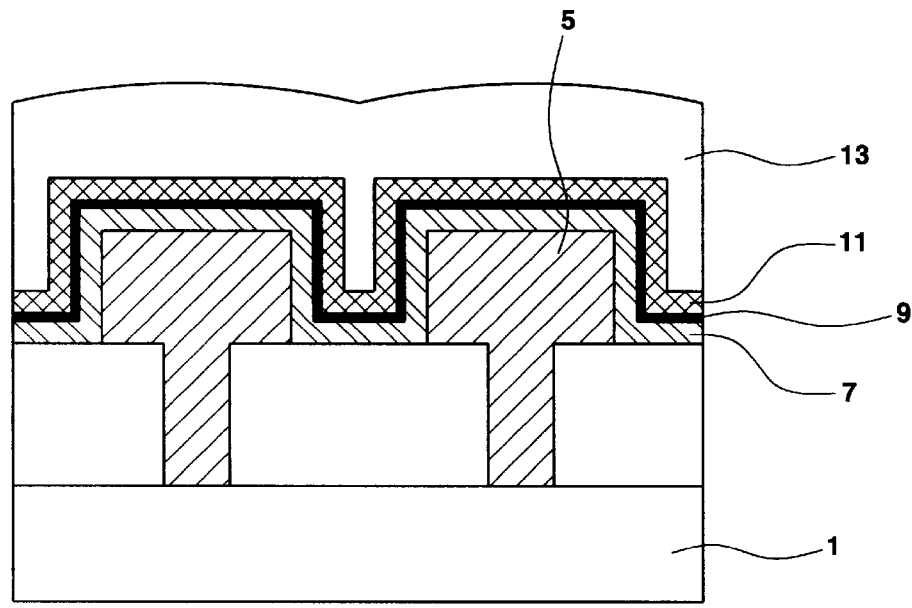
FIG. 1 is a cross-sectional view for illustrating an embodiment of a semiconductor capacitor with a $Ta_2O_5$ layer as a dielectric layer in accordance with the prior art.
Figure 2:
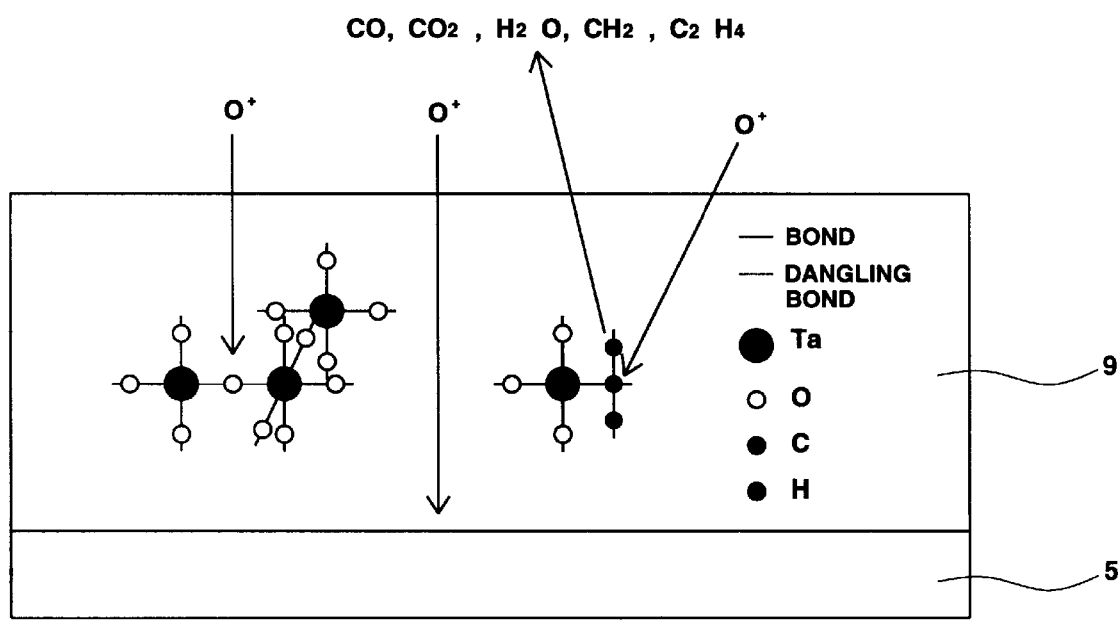
FIG. 2 is a schematic view for illustrating internal chemical composition and properties of the $Ta_2O_5$ layer shown in FIG. 1.
Figure 3:
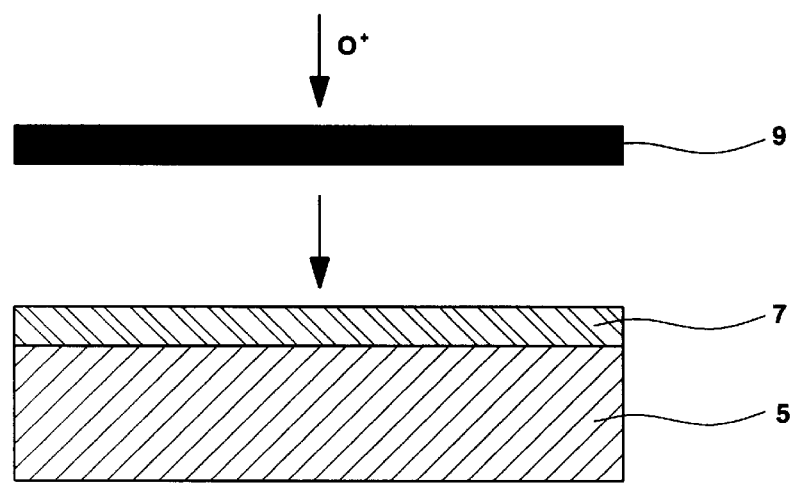
FIG. 3 is a cross-sectional view for illustrating a process of forming a $Ta_2O_5$—$Al_2O_3$ layer on a polysilicon layer, a low electrode of an storage node in accordance with the present invention.

FIG. 3 is a cross-sectional view for illustrating a process of forming a $Ta_2O_5$—$Al_2O_3$ layer on a polysilicon layer, a low electrode of an storage node in accordance with the present invention.

As shown in FIG. 3, in the process of forming the $Ta_2O_5$—$Al_2O_3$ layer, if an amorphous $Ta_2O_5$—$Al_2O_3$ deposition process and a low temperature thermal process like in-situ or ex-situ plasma annealing process or UV—$O_3$ annealing process are performed together, the substitution type Ta atoms are oxidized more effectively to stabilize the unstable stoichiometry ($Ta_xO_y$) of the $Ta_2O_5$ layer and minimize the influence of impurities like hydrocarbons to impose superior electrical characteristics in current leakage and breakdown voltage and obtain. As a result, it becomes possible to obtain a higher quality $Ta_2O_5$—$Al_2O_3$ dielectric layer than the conventional $Ta_2O_5$ dielectric layer.

In addition, in order to prevent the Si in the polysilicon layer of a bottom electrode from reacting with TiN layer of the plate electrode through the amorphous $Ta_2O_5$—$Al_2O_3$ layer to form Ti-silicide, a high temperature thermal process is performed to induce crystallization for enhancement of $Ta_2O_5$—$Al_2O_3$ bonding force. Therefore, it is possible to prevent deterioration in physiochemical properties of the $Ta_2O_5$—$Al_2O_3$ layer and achieve a capacitor with a superior electrical characteristic because the crystallized $Ta_2O_5$—$Al_2O_3$ layer has a higher dielectric characteristic than the amorphous $Ta_2O_5$ layer.

In consequence, after deposition of the $Ta_2O_5$—$Al_2O_3$ layer, the $Ta_2O_5$—$Al_2O_3$ layer is annealed at a high temperature to refrain Si of the polysilicon layer, the bottom electrode, from reacting with the top TiN electrode through the amorphous $Ta_2O_5$—$Al_2O_3$ layer to form Ti-silicide. Through a crystallization process, the bonding force of the $Ta_2O_5$—$Al_2O_3$ layer is enhanced much enough to prevent deterioration of the physiochemical properties of the layer. At the same time, because the crystallized $Ta_2O_5$—$Al_2O_3$ layer has a higher dielectric characteristic than the amorphous layer, a superior electrical characteristic of a capacitor results from the annealing process of the layer at a high temperature.

Figure 4:
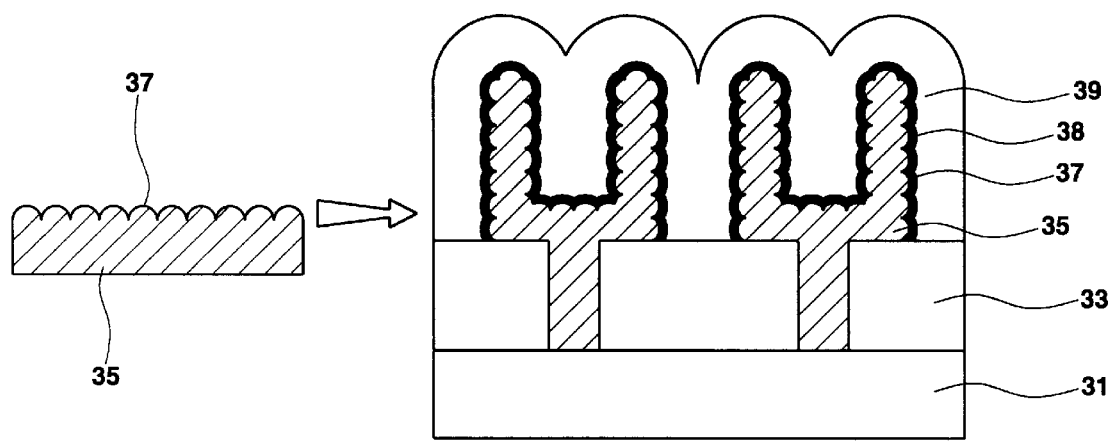
FIG. 4 is a cross-sectional view for illustrating a capacitor completely fabricated in accordance with a method of the present invention.

FIG. 4 is a cross-sectional view for illustrating a capacitor completely fabricated in accordance with a method of the present invention.

As shown in FIG. 4, the hemispherical grain shaped polysilicon layer 37 is deposited on a cylindrical or three dimensionally patterned capacitor module 35 in a LPCVD chamber to be used as a storage node, bottom electrode.

Figure 5:
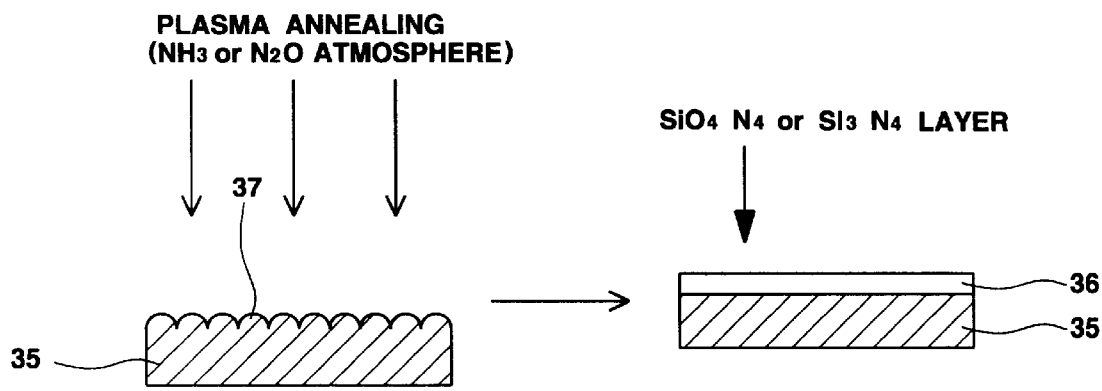
FIG. 5 is a cross-sectional view for illustrating a process of nitrifying the surface of a polysilicon layer to prevent formation of a natural oxide layer on the bordering surface between hemispherical polysilicon layer and amorphous $Ta_2O_5$—$Al_2O_3$ layer.

FIG. 5 is a cross-sectional view for illustrating a process of nitrifying the surface of a polysilicon layer to prevent formation of a natural oxide layer on the interface between hemispherical polysilicon layer and amorphous $Ta_2O_5$—$Al_2O_3$ layer. As shown in FIG. 5, a high temperature thermal process is followed to the interface between the hemispherical polysilicon layer 37 and amorphous $Ta_2O_5$—$Al_2O_3$ layer to eliminate all the impurity like carbon or water that may remain in the amorphous $Ta_2O_5$—$Al_2O_3$ layer or to crystallize the amorphous $Ta_2O_5$—$Al_2O_3$ layer in an annealing process. In order to prevent formation of an oxide layer ($SiO_2$) having a low dielectric characteristic, the polysilicon surface is nitrified through an in-situ plasma process at the temperature of 200~400 centigrade in $NH_3$ (or $N_2O$) gas atmosphere, or a rapid thermal nitridation process is performed at the temperature of 750~950 centigrade for 1~30 minutes.

Figure 6:
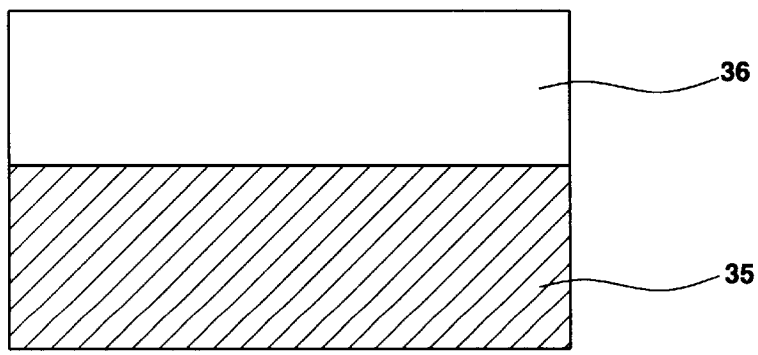
FIG. 6 is a cross-sectional view for illustrating a process of forming an amorphous $Ta_2O_5$—$Al_2O_3$ layer through a surface chemical reaction occurring on a wafer.

FIG. 6 is a cross-sectional view for illustrating a process of forming an amorphous $Ta_2O_5$—$Al_2O_3$ layer through a surface chemical reaction occurring on a wafer.

As shown in FIG. 6, the amorphous $Ta_2O_5$—$Al_2O_3$ layer is formed through a surface chemical reaction occurring on wafer. In the surface chemical reaction, the gas phase reaction is oppressed in the LPCVD chamber and, at the same time, an amorphous $(Ta_2O_5)_{1-x}$—$(Al_2O_3)_x$ layer ($0 \leq x \leq 0.5$) is deposited in a desired thickness by using the following chemical vapor.

First of all, Ta containing chemical vapor is obtained by evaporating in the temperature range of 150~200 centigrade a predetermined quantity of tantalume ethylate $Ta(OC_2H_5)_5$ solution supplied from vaporizer or evaporation tube through a flow controller like a mass flow controller (MFC).

On the other hand, Al containing chemical vapor is obtained by evaporating in the temperature range of 180~250 centigrade a predetermined quantity of aluminum ethylate $Al(OC_2H_5)_3$ solution supplied from vaporizer or evaporation tube through a flow controller like a mass flow controller (MFC).

Then, the chemical vapors obtained through the aforementioned methods are surface reacted in the mole fraction ratio of Al/Ta=0.01~1.0 along in excessive oxygen gas in the LPCVD chamber to thereby form a $(Ta_2O_5)_{1-x}$—$(Al_2O_3)_x$ layer.

In order to obtain the Al containing chemical vapor, an Al compound, aluminum hydroxide ($AlOH_3$) is used as a precursor, which is then dissolved and evaporated in an alcohol like ethanol, or butanol and water at the temperature of 100~500 centigrade to further react in the LPCVD chamber.

As shown in FIG. 6, after deposition of the $(Ta_2O_5)_{1-x}$—$(Al_2O_3)_x$ layer, crystallization is induced by annealing the layer at the temperature of 800~900 centigrade in $N_2O$ or $O_2$ gas atmosphere in an electrical furnace for 10~60 minutes. The thermal treatment process for crystallization of the $(Ta_2O_5)_{1-x}$—$(Al_2O_3)_x$ layer can also be performed through a rapid thermal process at the temperature of 700~900 centigrade in $N_2O$ or $O_2$ gas atmosphere.

On the other hand, after deposition of the polysilicon layer as the bottom electrode, the storage node, HF vapor or HF solution can be used in the in-situ or ex-situ state to eliminate a natural silicon oxide layer. Then, the $Ta_2O_5$—$Al_2O_3$ layer can be deposited thereon.

Furthermore, after the process of treating the surface of the polysilicon layer with HF vapor or solution, ammonia solution $NH_4OH$ or sulfuric acid solution $H_2SO_4$ can be used for treating the polysilicon surface. Then, the $Ta_2O_5$—$Al_2O_3$ layer can be deposited thereon.

In addition, when the $Ta_2O_5$—$Al_2O_3$ layer can be deposited as a dielectric layer, the substitution type Ta and carbon vacancy atoms remaining in the layer is oxidized to improve bonding force and stabilize the unstable stoichiometry ($Ta_xO_y$) of the $Ta_2O_5$ layer by performing thermal treatment at the temperature of 300~600 centigrade with N2O (or O2) plasma or UV—$O_3$.

Meanwhile, in order to oxidize the substitution type Ta or carbon vacancy atoms remaining in the $Ta_2O_5$—$Al_2O_3$ layer in the in-situ state with $N_2O$ or $O_2$ plasma, an amorphous $(Ta_2S)_{1-x}$—$(Al_2O_3)_x$ layer is deposited in the LPCVD chamber through sequential multi-stage deposition process. In other words, when the amorphous $(Ta_2O_5)$—$(Al_2O_3)$ layer is deposited as a dielectric layer, the amorphous $(Ta_2O_5)_{1-x}$—$(Al_2O_3)_x$ layer is deposited in the LPCVD chamber for the first time, and then annealed by using $N_2O$ or $O_2$ plasma in the in-situ state. Furthermore, $(Ta_2O_5)_{1-x}$—$(Al_2O_3)_x$ layer is deposited and annealed for the second time.

In addition, before deposition of the amorphous $(Ta_2O_5)_{1-x}$—$(Al_2O_3)_x$ layer, the in-situ plasma process can be performed for nitridation in ammonia atmosphere to increase oxidation resistance, or a low temperature thermal process in $N_2O$ or $O_2$ atmosphere can be performed for improving structural defect or heterogeneity caused by the dangling bonds.

In order to oxidize substitution type Ta and carbon vacancy atoms remaining in the dielectric layer, an amorphous $(Ta_2O_5)_{1-x}$—$(Al_2O_3)_x$ layer is deposited in the LPCVD chamber for the first time, and, then, UV—$O_3$ process can be applied in the ex-situ state.

On the other hand, the deposition of amorphous $Ta_2O_5$—$Al_2O_3$ layer can also be achieved by a sequential multi-stage deposition processes: by depositing an amorphous $(Ta_2O_5)_{1-x}$—$(Al_2O_3)_x$ layer and annealing it in the ex-situ state with UV—$O_3$ for the first time; and further depositing the amorphous $(Ta_2O_5)_{1-x}$—$(Al_2O_3)_x$ layer and annealing it with plasma for the second time.

In addition, even if the amorphous $(Ta_2O_5)_{1-x}$—$(Al_2O_3)_x$ layer is deposited in the LPCVD chamber, a low temperature thermal process can also be performed to the amorphous $(Ta_2O_5)_{1-x}$—$(Al_2O_3)_x$ layer in the ex-situ state with $N_2O$ or $O_2$ plasma or UV—$O_3$ at the temperature of 300~600 centigrade for 1~30 minutes.

Figure 7:
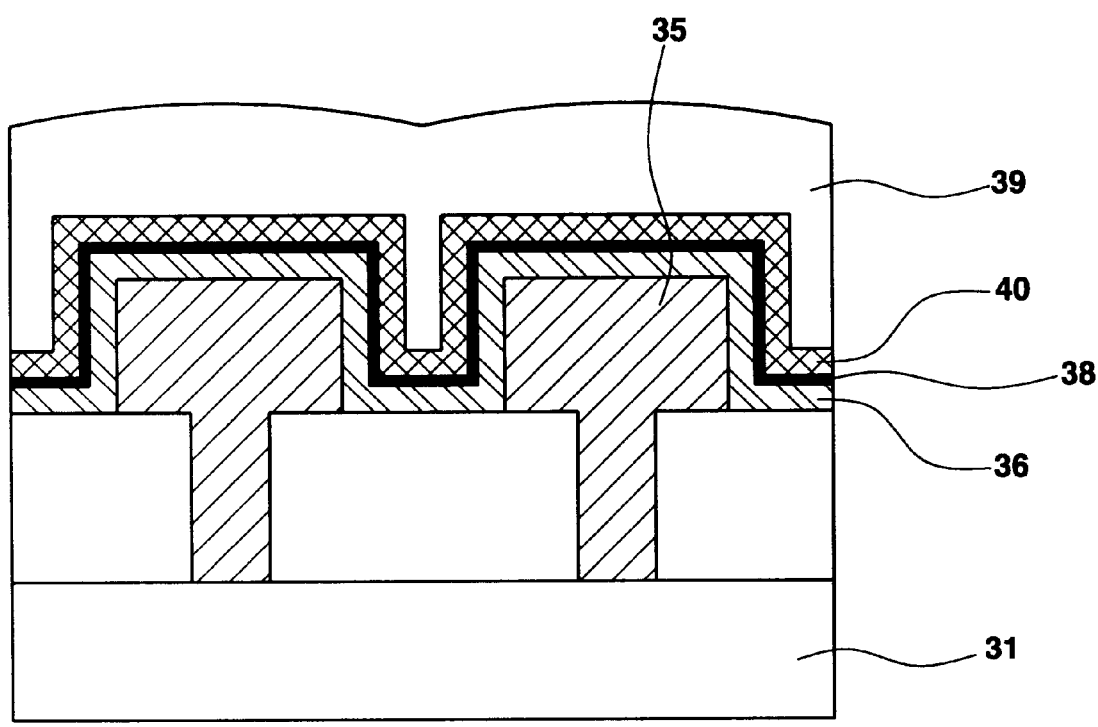
FIG. 7 is a cross-sectional view for illustrating a capacitor completely formed by depositing TiN and polysilicon to form a top electrode.

On the other hand, FIG. 7 is a cross-sectional view for illustrating a capacitor completely formed by depositing TiN and polysilicon to form an top electrode.

As shown in FIG. 7, TiN 40 and polysilicon 41 are deposited to form the top electrode to complete formation of the capacitor.

At this time, in case of the $(Ta_2O_5)_{1-x}$—$(Al_2O_3)_x$ layer 38, the top and bottom electrodes can be made by selecting one metal out of TiN, TaN, W, WN, Wsi, Ru, $RuO_2$, Ir, $IrO_2$, Pt and doped polysilicon.

As described above, there are a number of advantages, which will be described below, in the method for fabricating a capacitor of a semiconductor device of the present invention, in which aluminum containing compound is added to obtain a dielectric material like $Ta_2O_5$—$Al_2O_3$ with higher dielectric characteristic and structural stability than $Ta_2O_5$ layer.

At first, as it is possible to obtain a $Ta_2O_5$—$Al_2O_3$ layer with a higher dielectric constant ($\epsilon$=40) in the present invention, the capacitor with a $Ta_2O_5$—$Al_2O_3$ layer can results in a larger capacitance than the capacitor with conventional NO dielectric layer ($\epsilon$=7) or $Ta_2O_5$ layer ($\epsilon$=25).

Secondly, due to the high dielectric constant of the $Ta_2O_5$—$Al_2O_3$ layer, it is not necessary to form complex 3-dimensional structure of a capacitor to increase the area of the storage node. Therefore, even if the bottom electrode is formed in a simple stack structure through a process of conveniently fabricating a capacitor module, sufficient capacitance can be acquired. Therefore, it is possible to reduce the number of steps and manufacturing time and cost involved in the fabrication processes of the capacitor.

Thirdly, since the $Al_2O_3$ in the perovskite structure ($ABO_3$) with high mechanical and electrical strength forms covalent bonds with $Ta_2O_5$, the $Ta_2O_5$—$Al_2O_3$ layer is more stable in structure and stronger to external electrical impact than the $Ta_2O_5$ layer. Additionally, as described above, the $Ta_2O_5$—$Al_2O_3$ layer has higher electrical properties such as a low level of current leakage or insulation breakdown than the $Ta_2O_5$ layer.

Fourthly, after the amorphous $Ta_2O_5$—$Al_2O_3$ layer is deposited in the aforementioned method, the $Ta_2O_5$—$Al_2O_3$ layer is annealed in an electrical furnace at a predetermined condition for crystallization, so that the crystallized $Ta_2O_5$—$Al_2O_3$ layer has much higher dielectric constant and capacitance.

On the other hand, only one thermal process can eliminate impurities like carbon and water remaining in the process of forming the dielectric layer, so that an additional annealing process is not needed to reduce the level of current leakage in the fabricating procedure of the $Ta_2O_5$—$Al_2O_3$ capacitor, differently from that of a $Ta_2O_5$ capacitor, thereby improving the yield in the capacitor manufacturing process.

What is claimed is:

1. A method for fabricating a capacitor of a semiconductor device comprising the steps of:

forming a hemispherical polysilicon layer on a bottom electrode of a storage node;

nitrifying the surface of the polysilicon layer for preventing formation of a natural oxide layer on the hemispherical polysilicon layer;

forming a $Ta_2O_5$—$Al_2O_3$ layer as a dielectric layer on the surface nitrified polysilicon layer; and forming a plate electrode by depositing metal on the $Ta_2O_5$—$Al_2O_3$ layer.

2. The method, as defined in claim 1, wherein the bottom electrode of the storage node is made in simple stack structure, cylindrical shape based double structure or complex 3-dimensional structure.

3. The method, as defined in claim 1, wherein the hemispherical grain shaped polysilicon layer is formed in a LPCVD chamber.

4. The method, as defined in claim 1, wherein a rapid thermal nitridation process is performed in an in-situ state at 750~900 centigrade in ammonia gas (NH3) atmosphere for 1~30 minutes in order to nitrify the surface of the polysilicon layer.

5. The method, as defined in claim 1, wherein an annealing process is performed in an in-situ state with plasma at 200~400 centigrade in ammonia gas (NH3) atmosphere in order to nitrify the surface of the polysilicon layer.

6. The method, as defined in claim 1, wherein, after formation of the polysilicon layer as the bottom electrode, storage node, HF vapor or HF solution is used in the in-situ or ex-situ state for eliminating a natural silicon oxide layer, and a $Ta_2O_5$—$Al_2O_3$ layer is then deposited thereon.

7. The method, as defined in claim 6, wherein, before and after the HF surface treatment process, a compound including ammonia solution $NH_4OH$ or sulfuric acid solution $H_2SO_4$ can be used for treating a polysilicon surface, and the $Ta_2O_5$—$Al_2O_3$ layer is, then, deposited thereon.

8. The method, as defined in claim 6, wherein the $Ta_2O_5$—$Al_2O_3$ layer is formed through a CVD method to have the mole fraction ratio of Al/Ta=0.01~1.0.

9. The method, as defined in claim 1, wherein Ta containing chemical vapor is obtained by evaporating in the temperature range of 150~200 centigrade a predetermined quantity of tantalume ethylate $Ta(OC_2H_5)_5$ solution supplied from vaporizer or evaporation tube through a flow controller.

10. The method, as defined in claim 8, wherein Ta containing chemical vapor is obtained by evaporating in the temperature range of 150~200 centigrade a predetermined quantity of tantalume ethylate $Ta(OC_2H_5)_5$ solution supplied from vaporizer or evaporation tube through a flow controller.

11. The method, as defined in claim 1, wherein Al containing chemical vapor is obtained by evaporating in the temperature range of 150–200 centigrade a predetermined quantity of aluminum ethylate $Al(OC_2H_5)_3$ solution supplied from vaporizer or evaporation tube through a flow controller.

12. The method, as defined in claim 8, wherein Al containing chemical vapor is obtained by evaporating in the temperature range of 150–200 centigrade a predetermined quantity of aluminum ethylate $Al(OC_2H_5)_3$ solution supplied from vaporizer or evaporation tube through a flow controller.

13. The method, as defined in claim 1, wherein Al containing chemical vapor is obtained by using Al compound, aluminum hydroxide $AlOH_3$ as a precursor.

14. The method, as defined in claim 8, wherein Al containing chemical vapor is obtained by using Al compound, aluminum hydroxide $AlOH_3$ as a precursor.

15. The method, as defined in claim 13, wherein the Al precursor is dissolved and evaporated in an alcohol like ethanol, or butanol and water at the temperature of 100~500 centigrade to thereby react in a LPCVD chamber.

16. The method, as defined in claim 1, wherein the $Ta_2O_5$—$Al_2O_3$ layer is deposited by inducing a surface chemical reaction in the mole fraction ratio of Al/Ta= 0.01~1.0 along with excessive oxygen gas in the LPCVD chamber.

17. The method, as defined in claim 1, wherein, after a step of depositing the $Ta_2O_5$—$Al_2O_3$ layer, a thermal treatment can be made at the temperature of 300~600 centigrade with N2O(or O2) plasma or UV—$O_3$.

18. The method, as defined in claim 1, wherein an amorphous $(Ta_2O_5)_{X-1}$—$(Al_2O_3)_x$ layer is deposited in the LPCVD chamber for the first time and, then, annealed by using $N_2O$ or $O_2$ plasma in the in-situ state.

19. The method, as defined in claim 15, wherein an amorphous $(Ta_2O_5)_{X-1}$—$(Al_2O_3)_x$ layer is deposited in the LPCVD chamber for the first time and, then, annealed by using $N_2O$ or $O_2$ plasma in the in-situ state.

20. The method, as defined in claim 1, wherein the $Ta_2O_5$—$Al_2O_3$ layer is deposited as a dielectric layer through a sequential multi-stage deposition process: an amorphous $(Ta_2O_5)_{X-1}$—$(Al_2O_3)_x$ layer is deposited in the LPCVD chamber for the first time and, then, annealed by using $N_2O$ or $O_2$ plasma in the in-situ state; and the amorphous $(Ta_2O_5)_{X-1}$—$(Al_2O_3)_x$ layer is further deposited and annealed for the second time.

21. The method, as defined in claim 15, wherein the $Ta_2O_5$—$Al_2O_3$ layer is deposited as a dielectric layer through a sequential multi-stage deposition process: an amorphous $(Ta_2O_5)_{X-1}$—$(Al_2O_3)_x$ layer is deposited in the LPCVD chamber for the first time and, then, annealed by using $N_2O$ or $O_2$ plasma in the in-situ state; and the amorphous $(Ta_2O_5)_{X-1}$—$(Al_2O_3)_x$ layer is further deposited and annealed for the second time.

22. The method, as defined in claim 1, wherein the $Ta_2O_5$—$Al_2O_3$ layer is deposited as a dielectric layer through a sequential multi-stage deposition process: an amorphous $(Ta_2O_5)_{X-1}$—$(Al_2O_3)_x$ layer is deposited in the LPCVD chamber for the first time and, then, annealed by using UV—$O_3$ in the ex-situ state; and the amorphous $(Ta_2O_5)_{X-1}$—$(Al_2O_3)_x$ layer is further deposited and annealed with plasma for the second time.

23. The method, as defined in claim 1, wherein an amorphous $(Ta_2O_5)_{X-1}$—$(Al_2O_3)_x$ layer is deposited in the LPCVD chamber and a low temperature thermal process is, then, performed in the ex-situ state by using $N_2O$ or $O_2$ plasma or UV—$O_3$ at the temperature of 300~600 centigrade for 1~30 minutes.

24. The method, as defined in claim 1, wherein, after deposition of the $Ta_2O_5$—$Al_2O_3$ layer, an electrical furnace or rapid thermal process is applied as the following thermal treatment process at the temperature of 300~600 centigrade in $N_2O$ or $O_2$ atmosphere for 10~60 minutes.

25. The method, as defined in claim 1, wherein, after deposition of the $(Ta_2O_5)_{X-1}$—$(Al_2O_3)_x$ layer, a thermal treatment is performed in an in-situ state with plasma at the temperature of 300~500 centigrade in $NH_3$ or $N_2$ atmosphere to nitrify the $(Ta_2O_5)_{X-1}$—$(Al_2O_3)_x$ dielectric surface.

26. The method, as defined in claim 1, wherein, after deposition of the $(Ta_2O_{5X})$—$(Al_2O_3)_x$ layer, an electrical furnace or rapid thermal process is used at the temperature of 700~900 centigrade in $NH_3$ or $N_2$ atmosphere to nitrtify surface and crystallize $(Ta_2O_5)_{X-1}$—$(Al_2O_3)_x$ layer.

27. The method, as defined in claim 1, wherein the top and bottom electrodes are made by selecting one metal among TiN, TaN, W, WN, Wsi, Ru, $RuO_2$, Ir, $IrO_2$, Pt and doped polysilicon.

28. The method, as defined in claim 1, wherein polysilicon or other metal is doped to form top and bottom electrodes by using PE-CVD method, RF magnetic sputtering method or LPCVD method.

29. The method, as defined in claim 27, wherein polysilicon or other metal is doped to form top and bottom electrodes by using PE-CVD method, RF magnetic sputtering method or LPCVD method.

* * * * *

UNITED STATES PATENT AND TRADEMARK OFFICE
CERTIFICATE OF CORRECTION

PATENT NO. : 6,207,528 B1
DATED : March 27, 2001
INVENTOR(S) : Kee-jeung Lee

It is certified that error appears in the above-identified patent and that said Letters Patent is hereby corrected as shown below:

Column 7, claim 17,
Line 37, delete "N2O(or O2)" and insert -- $N_2O$(or $O_2$) --.

Column 8, claim 22,
Line 12, delete "$(Ta_2O_5)_{x-1}$-$(Al_2O_3)$" and insert -- $(Ta_2O_5)_{x-1}$-$(Al_2O_3)_x$ --.

Signed and Sealed this

Twelfth Day of March, 2002

Attest:

Attesting Officer

JAMES E. ROGAN
Director of the United States Patent and Trademark Office